United States Patent
Li et al.

(10) Patent No.: US 11,187,926 B2
(45) Date of Patent: Nov. 30, 2021

(54) BINDING DEVICE, DISPLAY PANEL, BINDING SYSTEM AND OPERATING METHOD THEREOF

(71) Applicants: BOE TECHNOLOGY GROUP CO., LTD., Beijing (CN); FUZHOU BOE OPTOELECTRONICS TECHNOLOGY CO., LTD., Fujian (CN)

(72) Inventors: Dongxi Li, Beijing (CN); Jianfeng Yuan, Beijing (CN); Weiqiang Li, Beijing (CN)

(73) Assignees: BOE TECHNOLOGY GROUP CO., LTD., Beijing (CN); FUZHOU BOE OPTOELECTRONICS TECHNOLOGY CO., LTD., Fujian (CN)

( * ) Notice: Subject to any disclaimer, the term of this patent is extended or adjusted under 35 U.S.C. 154(b) by 628 days.

(21) Appl. No.: 15/720,995

(22) Filed: Sep. 29, 2017

(65) Prior Publication Data

US 2018/0240693 A1    Aug. 23, 2018

(30) Foreign Application Priority Data

Feb. 17, 2017 (CN) .......................... 201710086461.9

(51) Int. Cl.
   *G02F 1/13* (2006.01)
   *G02F 1/1345* (2006.01)
   (Continued)

(52) U.S. Cl.
   CPC ........ *G02F 1/1303* (2013.01); *G02F 1/13452* (2013.01); *H01L 21/67259* (2013.01);
   (Continued)

(58) Field of Classification Search
   CPC ......... H01L 21/67259; H01L 21/67265; H01L 23/544; H01L 2224/759; H01L 2224/75901
   See application file for complete search history.

(56) References Cited

U.S. PATENT DOCUMENTS 5,155,777 A    10/1992   Angelopoulos et al.
8,625,879 B2 *  1/2014   Motohara .......... H05K 13/0069
                                              382/151
(Continued)

FOREIGN PATENT DOCUMENTS

CN           1448768 A    10/2003
CN         101893772 A    11/2010
(Continued)

OTHER PUBLICATIONS

First Office Action for Chinese Application No. 201710086461.9, dated Feb. 26, 2019, 7 Pages.

*Primary Examiner* — Philip C Tucker
*Assistant Examiner* — Jimmy R Smith, Jr.
(74) *Attorney, Agent, or Firm* — Brooks Kushman P.C.

(57) ABSTRACT

The present disclosure provides a binding device, a display panel, a binding system and an operating method thereof. The binding system includes the binding device and the display panel. The binding device includes a binding head, a support platform, a light emitter and a light receiver. Through a first alignment hole in the binding head, an alignment mark on the display panel and a second alignment hole in the support platform, the binding system monitors in real time a position and/or posture of the binding head, a position and/or flatness of a binding region of the display panel and an alignment degree between the binding head and the display panel using the light emitter and the light receiver.

2 Claims, 11 Drawing Sheets

(51) Int. Cl.
    *H01L 21/67*    (2006.01)
    *H01L 23/544*   (2006.01)
(52) U.S. Cl.
    CPC .............. *H01L 23/544* (2013.01); *G02F 1/13*
                      (2013.01); *H01L 2224/759* (2013.01)

(56) References Cited

U.S. PATENT DOCUMENTS

| | | | |
|---|---|---|---|
| 2002/0124399 A1* | 9/2002 | Ogimoto | H01L 21/67144 |
| | | | 29/833 |
| 2003/0168176 A1 | 9/2003 | Byun et al. | |
| 2016/0215396 A1* | 7/2016 | Khandelwal | C23C 16/52 |
| 2016/0324042 A1 | 11/2016 | Wu | |
| 2018/0053664 A1 | 2/2018 | Wang et al. | |

FOREIGN PATENT DOCUMENTS

| | | |
|---|---|---|
| CN | 104777652 A | 7/2015 |
| CN | 106292004 A | 1/2017 |
| JP | H04105330 A | 4/1992 |

\* cited by examiner

BINDING DEVICE, DISPLAY PANEL, BINDING SYSTEM AND OPERATING METHOD THEREOF

CROSS-REFERENCE TO RELATED APPLICATION

This application claims priority to Chinese Patent Application No. 201710086461.9 filed on Feb. 17, 2017, which is incorporated herein by reference in its entirety.

TECHNICAL FIELD

The present disclosure relates to a binding device, a display panel, a binding system and an operating method of the binding system.

BACKGROUND

For a display device, usually two ends of a flexible circuit board are bound, through a binding process, to a binding region of a display panel and a binding region of a driving printed circuit board, so as to electrically connect the driving printed circuit board and the display panel. Commonly-used techniques include Flexible Printed Circuit (FPC), Flexible Flat Cable (FFC), Chip On Glass (COG, i.e., a chip is directly bound to glass), and Chip On Film (COF, i.e., the chip is directly mounted on the flexible printed circuit).

In the related art, during continuous binding operation, it is impossible to monitor in real time a position of a binding head and flatness of the binding region of the display panel. In the case that the binding head is inclined or the binding region of the display panel is not flat, it is impossible to achieve accurate alignment for the binding. At this time, the driver circuit may be electrically connected in a deficient manner, or may not be electrically connected, to the display panel, and thereby defective products may occur.

SUMMARY

In one aspect, the present disclosure provides in some embodiments a binding device, including a binding head, a support platform, at least one light emitter and at least one light receiver. The binding head is provided with at least one first alignment hole, and the support platform is provided with at least one second alignment hole at a position corresponding to the first alignment hole. The light emitter is configured to emit light toward the first alignment hole or the second alignment hole, and the light receiver is configured to receive the light from the light emitter through the second alignment hole or the first alignment hole. The binding head is configured to move reciprocably in a direction perpendicular to a support surface of the support platform.

In a possible embodiment of the present disclosure, the light emitter, the first alignment hole, the second alignment hole and the light receiver are arranged in such a manner that the light from the light emitter is transmitted through the first alignment hole and the second alignment hole and then received by the light receiver.

In a possible embodiment of the present disclosure, the binding device includes two light emitters and two light receivers, the binding head is provided with two first alignment holes, and the support platform is provided with two second alignment holes.

In a possible embodiment of the present disclosure, the first alignment hole penetrates through the binding head, and the light emitter is arranged at a side of the binding head away from the support platform.

In a possible embodiment of the present disclosure, the second alignment hole penetrates through the support platform, and the light receiver is arranged at a side of the support platform away from the binding head.

In a possible embodiment of the present disclosure, the light emitter is arranged inside the binding head and at one end of the first alignment hole away from the support platform.

In a possible embodiment of the present disclosure, the light receiver is arranged inside the support platform and at one end of the second alignment hole away from the binding head.

In a possible embodiment of the present disclosure, the binding device further includes a controller configured to control the light emitter to emit the light, control the light receiver to receive the light, and control the binding head to change its position and/or posture.

In another aspect, the present disclosure provides in some embodiments a display panel, including a display region and a binding region surrounding the display region. At least one alignment mark is arranged at the binding region for the alignment with the above-mentioned binding device.

In a possible embodiment of the present disclosure, the alignment mark includes a light-shielding region and a transparent region arranged inside the light-shielding region.

In a possible embodiment of the present disclosure, the alignment mark is of a circular structure.

In a possible embodiment of the present disclosure, a thin film transistor (TFT) is arranged at the display region, and the alignment mark is created from a layer identical to a gate electrode of the TFT or a source/drain electrode of the TFT.

In yet another aspect, the present disclosure provides in some embodiments a binding system including the above-mentioned binding device and a display panel. The display panel includes a display region and a binding region surrounding the display region, at least one alignment mark is arranged at the binding region for the alignment with the binding device, and the support platform of the binding device is configured to support thereon the display panel.

In a possible embodiment of the present disclosure, the alignment mark is arranged in such a manner that the light from the light emitter is transmitted through the first alignment hole, the alignment mark and the second alignment hole and then received by the light receiver.

In a possible embodiment of the present disclosure, the alignment mark includes a light-shielding region and a transparent region arranged inside the light-shielding region.

In a possible embodiment of the present disclosure, the alignment mark is of a circular structure.

In a possible embodiment of the present disclosure, a TFT is arranged at the display region, and the alignment mark is created from a layer identical to a gate electrode of the TFT or a source/drain electrode of the TFT.

In still yet another aspect, the present disclosure provides in some embodiments an operating method for the above-mentioned binding system, including steps of aligning the binding head and aligning the display panel.

In a possible embodiment of the present disclosure, the step of aligning the binding head includes: emitting light by the light emitter; receiving the light by the light receiver through the first alignment hole and the second alignment hole; in the case that the received light forms a complete spot, determining that the binding head has been aligned successfully; and in the case that the received light fails to form the complete spot, adjusting a position and/or posture of the binding head until the complete spot is formed.

In a possible embodiment of the present disclosure, the step of aligning the display panel includes: placing the display panel onto a support surface of the support platform; emitting light by the light emitter; receiving, by the light receiver, the light through the first alignment hole, the second alignment hole and the alignment mark; in the case that the received light forms a complete spot, determining that the display panel has been aligned successfully; and in the case that the received light fails to form the complete spot, adjusting a position and/or flatness of the display panel until the complete spot is formed.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

FIG. 5b is an enlarged view of region R1 in FIG. 5a;

FIG. 6b is an enlarged view of region R2 in FIG. 6a;

FIG. 7b is an enlarged view of region R3 in FIG. 7a;

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

For a display device, usually two ends of a flexible circuit board are bound, through a binding process, to a binding region of a display panel and a binding region of a driving printed circuit board respectively, so as to electrically connect the driving printed circuit board to the display panel. Usually, during the binding operation, a pressure sensitive paper is used to determine flatness of a binding head, and then several samples may be used so as to test a binding effect. After a test result is positive, the subsequent consecutive binding operation may be performed on the basis of the test result. Hence, for the binding process, usually the consecutive binding operation may be performed on the basis of the binding effect of the samples. In the case that the binding head is inclined, the binding region of the display panel is not flat or a position of the binding head relative to the binding region of the display panel changes, the alignment for the binding may be inaccurate. At this time, the driver circuit may be electrically connected in a deficient manner, or may not be electrically connected, to the display panel, and thereby defective products may occur.

Figure 1A:
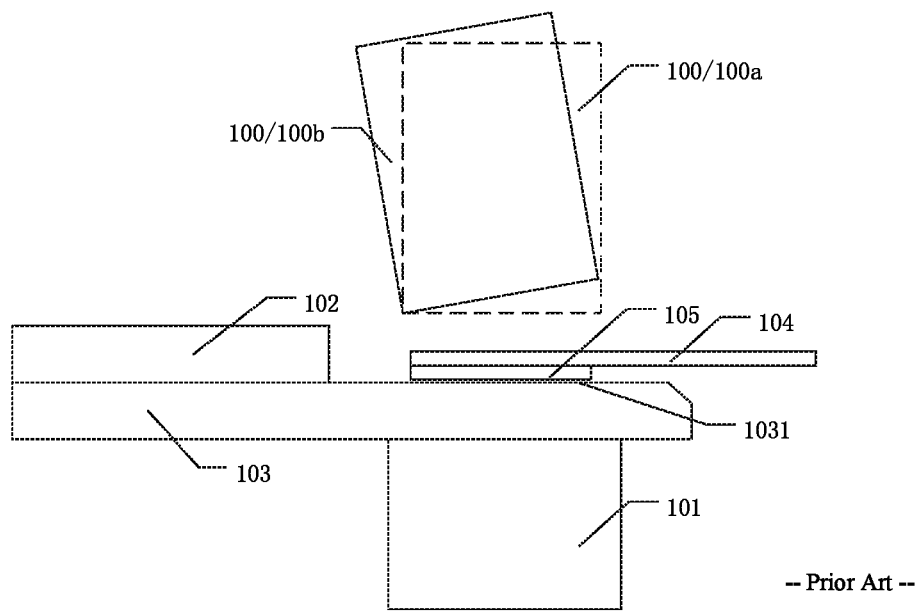
FIG. 1a is a side view of a binding system.
Figure 1B:
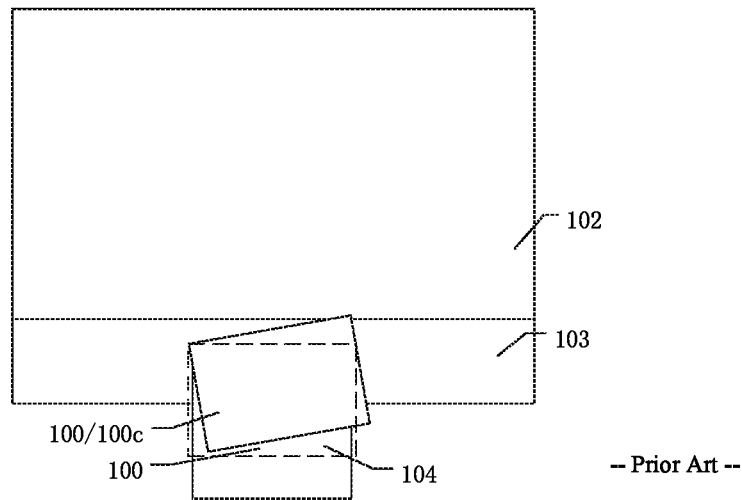
FIG. 1b is a top view of the binding system.

FIG. 1a is a side view of a binding system and FIG. 1b is a top view of the conventional binding system. As shown in FIG. 1a, the binding system includes a binding head 100, a support platform 101, a display panel (including an array substrate 103 and an opposite substrate 102) and a flexible circuit board 104. The display panel and the flexible circuit board 104 may be adhered to each other through an anisotropic electrically-conductive adhesive 105. The display panel is provided with a binding region 1031 to be bound to the flexible circuit board 104. During a consecutive binding process, the display panel is arranged on the support platform 101, and the anisotropic electrically-conductive adhesive 105 and the flexible circuit board 104 are arranged at a position corresponding to the binding region 1031 of the display panel. Then, the binding operation may be performed by heating or pressurizing the binding head on the basis of the binding effect of several samples. During the binding operation, as shown in FIG. 1a, in the case that the binding head is inclined, the binding head 100 may be switched from a state 1 (where the binding head is located at position 100a) to a state 2 (where the binding head is located at position 100b). At this time, during the binding operation (in the case that the binding head moves downward to perform the binding operation), the anisotropic electrically-conductive adhesive 105 and the flexible circuit board 104 may not be completely bound to the display panel. In addition, as shown in FIG. 1b, in the case that the binding head 100 is deflected from its position, it may be switched from the state 1 (where the binding head is located at position 100*a*) to a state 3 (where the binding head is located at position 100*c*). At this time, during the binding operation, the anisotropic electrically-conductive adhesive 105 and the flexible circuit board 104 may not be bound to the display panel accurately. In a word, in the case that the binding head 100 is inclined and/or deflected or the binding region of the display panel is not flat, the display panel may be electrically connected in a deficient manner, or may not be electrically connected, to the flexible circuit board 104, and thereby defective products may occur.

The present disclosure provides a binding device, a display panel, a binding system and an operating method for the binding system, so as to monitor in real time a position and/or posture of a binding head, a position and/or flatness of a binding region of the display panel, and an alignment accuracy between the binding head and the display panel.

The present disclosure provides in some embodiments a binding system, including a binding device and a display panel. The binding device includes a binding head, a support platform, at least one light emitter and at least one light receiver. The binding head is provided with at least one first alignment hole, and the support platform is provided with at least one second alignment hole at a position corresponding to the first alignment hole. The light emitter is configured to emit light toward the first alignment hole or the second alignment hole, and the light receiver is configured to receive the light from the light emitter through the second alignment hole or the first alignment hole. The binding head is configured to move reciprocably in a direction perpendicular to a support surface of the support platform. The display panel includes a display region and a binding region surrounding the display region, and at least one alignment mark is arranged at the binding region for the alignment with the binding device.

According to the binding device in the embodiments of the present disclosure, during the consecutive binding operation, through the first alignment hole in the binding head, the alignment mark on the display panel and the second alignment hole in the support platform, a position and/or posture of the binding head, a position and/or flatness of the binding region of the display panel, and an alignment degree between the binding head and the display panel may be monitored in real time using the light emitter and the light receiver. As a result, it is able to adjust in real time the position and/or posture of the binding head, the position and/or flatness of the binding region of the display panel and the alignment degree between the binding head and the display panel, thereby to improve the binding alignment accuracy, the binding effect and the binding efficiency, and increase the yield of the product.

The present disclosure will be described hereinafter in more details in conjunction with the embodiments.

Figure 2A:
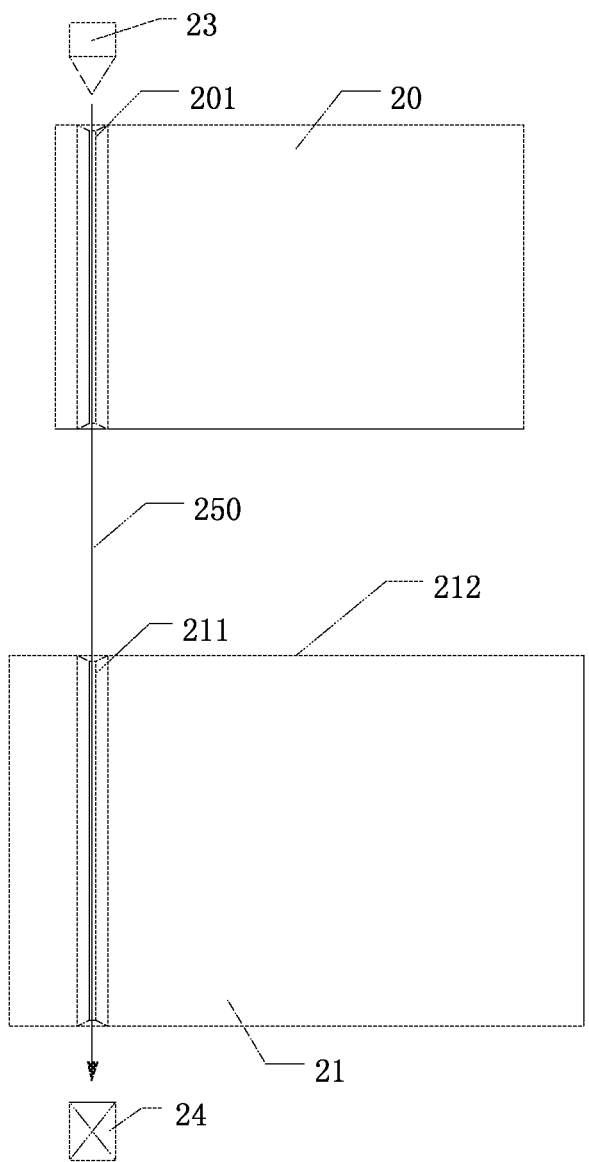
FIG. 2a is a side view of a binding device according to one embodiment of the present disclosure.
Figure 2B:
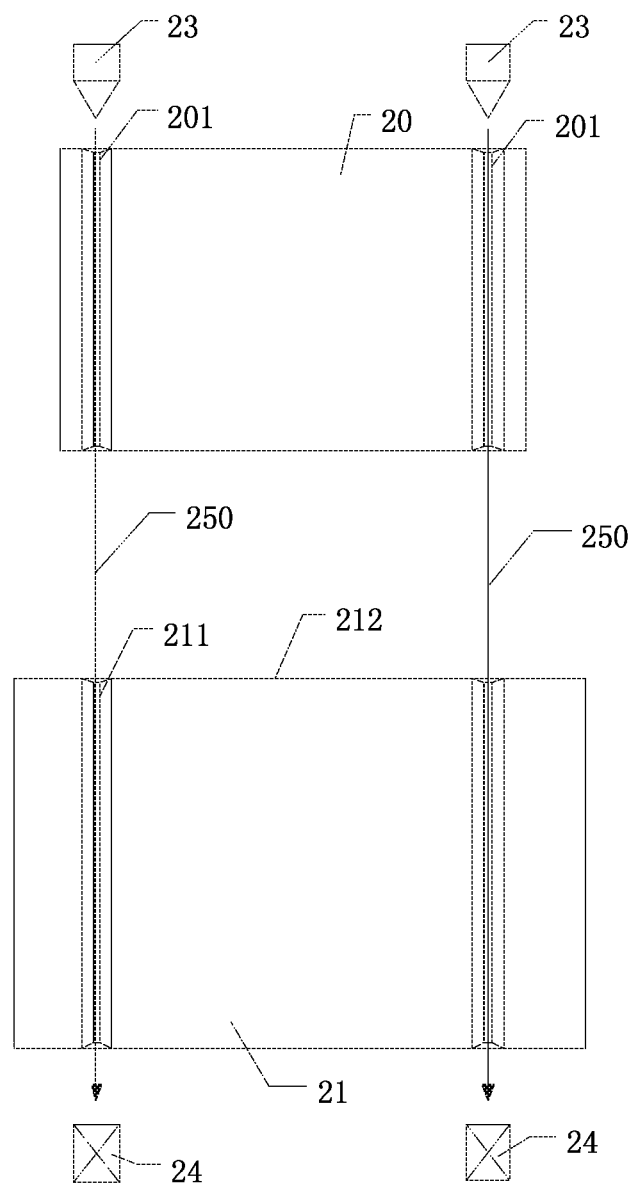
FIG. 2b is another side view of the binding device according to one embodiment of the present disclosure.
Figure 3:
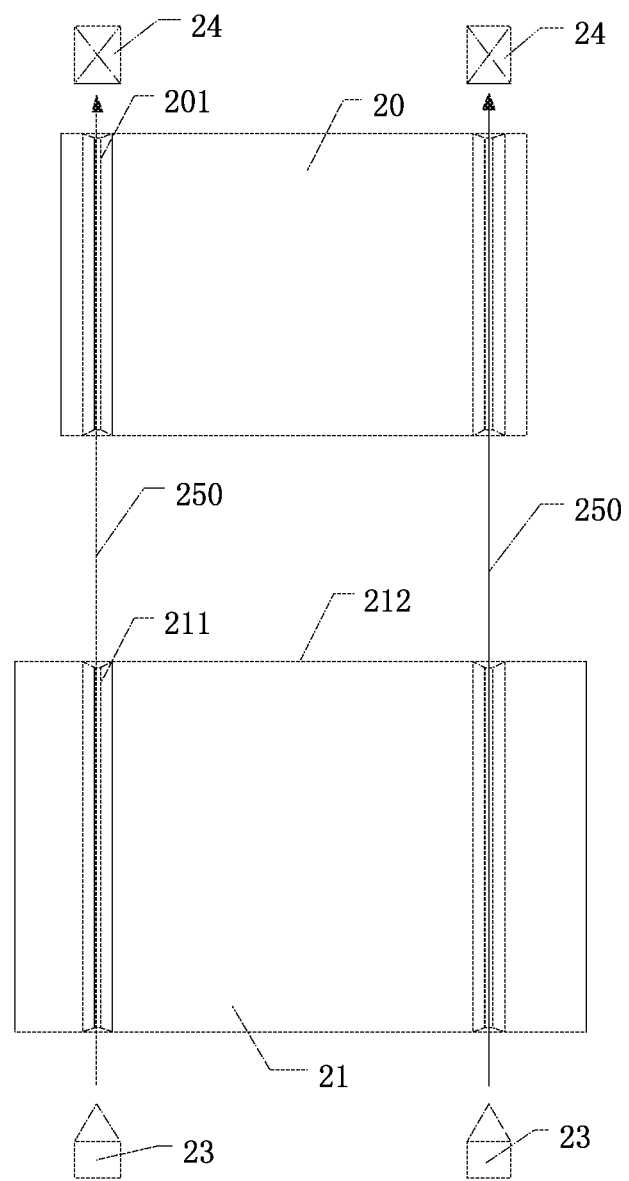
FIG. 3 is yet another side view of the binding device according to one embodiment of the present disclosure.

FIG. 2*a* is a side view of the binding device, FIG. 2*b* is another side view of the binding device, and FIG. 3 is yet another side view of the binding device. It should be appreciated that, for clarification, FIGS. 2*a*, 2*b* and 3 merely show a part of the binding device.

In a possible embodiment of the present disclosure, as shown in FIG. 2*a*, the binding device includes a binding head 20, a support platform 21, a light emitter 23 and a light receiver 24. The binding head 20 is provided with a first alignment hole 201, and the support platform 21 is provided with a second alignment hole 211 at a position corresponding to the first alignment hole. A surface of the support platform 21 adjacent to the binding head 20 is just a support surface 212 of the support platform. The light emitter 23 is configured to emit light 250, and the light receiver 24 is configured to receive the light 250. By detecting a size (or a shape) of a spot formed by the light 250 received by the light receiver 24, a position and/or a posture of the binding head 20 may be detected in real time. As a result, it is able to adjust in real time the position and/or posture of the binding head 20, thereby to improve the binding alignment accuracy, the binding effect and the binding efficiency, and increase the yield of the product.

In a possible embodiment of the present disclosure, the light emitter 23 may emit the light 250 toward the first alignment hole 201 or the second alignment hole 211, and the light receiver 24 may receive the light 250 from the light emitter 23 through the second alignment hole 211 or the first alignment hole 201.

In a possible embodiment of the present disclosure, the light emitter 23, the first alignment hole 201, the second alignment hole 211 and the light receiver 24 may be arranged in a one-to-one correspondence manner, i.e., the light emitter, the first alignment hole, the second alignment hole and the light receiver may be arranged in such a manner that the light from the light emitter is transmitted through the first alignment hole and the second alignment hole and then received by the light receiver.

In a possible embodiment of the present disclosure, there may be a plurality of light emitters 23, a plurality of first alignment holes 201, a plurality of second alignment holes 211 and a plurality of light receivers, which may be arranged in a one-to-one correspondence manner. As shown in FIG. 2*b*, the binding device may include two light emitters 23 and two light receivers 24, the binding head 20 may be provided with two first alignment holes 201 at positions corresponding to the two light emitters 23, and the support platform 21 may be provided with two second alignment holes 211 at positions corresponding to the two first alignment holes 201. Through the two first alignment holes 201, it is able to monitor in real time an inclination degree of the binding head 20 relative to the support surface 212, and monitor in real time a deflection degree of the binding head 20 in a direction parallel to the support surface 212.

It should be appreciated that, the inclination degree of the binding head 20 relative to the support surface 212 is represented by a size of an angle between a surface of the binding head 20 and the support surface 212. The larger the angle, the larger the inclination degree. In the case that the surface of the binding head 20 adjacent to the support platform 21 is parallel to the support surface 212, the angle is 0, i.e., the binding head is not inclined relative to the support surface.

In a possible embodiment of the present disclosure, the first alignment hole 201 may penetrate through the binding head 20, and the light emitter 23 may be arranged at a side of the binding head 20 away from the support platform 21. In a possible embodiment of the present disclosure, the first alignment hole 201 may also not penetrate through the binding head 20, and the light emitter 23 may be arranged inside the binding head 20, e.g., at one end of the first alignment hole away from the support platform.

In a possible embodiment of the present disclosure, the second alignment hole 211 may penetrate through the support platform 21, and the light receiver 24 may be arranged at a side of the support platform 21 away from the binding head 20. In a possible embodiment of the present disclosure, the second alignment hole 211 may not penetrate through the support platform 21, and the light receiver 24 may be arranged inside the support platform 21, e.g., at one end of the second alignment hole away from the binding head.

As shown in FIG. 3, in some possible embodiments of the present disclosure, the light emitter 23 may be also arranged at a side of the support platform 21 away from the binding head 20, and the light receiver 24 may be also arranged at a side of the binding head 20 away from the support platform 21. In some other possible embodiments of the present disclosure, the light receiver 24 may be also arranged inside the binding head 20, and the light emitter 23 may be also arranged inside the support platform 21.

In a possible embodiment of the present disclosure, the first alignment hole 201 may have a section of a circular or rectangular shape, and the second alignment hole 211 may also have a section of a circular or rectangular shape.

In a possible embodiment of the present disclosure, the binding head 20 may move reciprocally in a direction perpendicular to the support surface 212, so as to perform the binding operation. Here, the binding head 20 may be a solid or hollow cylinder, and it may be made of metal. The structure of the binding head will not be particularly defined herein, as long as it can apply a high temperature and a high pressure at the binding region so as to achieve the electrical connection between the driving printed circuit board and the display panel.

In a possible embodiment of the present disclosure, the light emitter 24 may be a laser emitter, e.g., a ruby laser, a nitrogen molecular laser, a gas laser, a solid laser, a semiconductor layer or a fiber laser. The light receiver 23 may be a laser receiver. A laser beam has a relatively small divergence angle, so it is able to perform the alignment in a more accurate manner through the laser emitter and the laser receiver.

In a possible embodiment of the present disclosure, the binding device further includes a controller configured to control the light emitter 23 to emit the light 250, control the light receiver 24 to receive the light 250 and adjust the position and/or posture of the binding head 20. In a possible embodiment of the present disclosure, the controller may control the binding head 20 to rotate and/or move in a direction parallel to the support surface 212, so as to adjust the position and/or posture of the binding head 20.

In a possible embodiment of the present disclosure, the controller may include some known circuits, so as to drive the light emitter 23 to emit the light 250, and control the light receiver 24 to receive the light 250. It may further include a power and transmission member such as motor, gear and belt, so as to drive the binding head to rotate and/or move. For example, the controller may include a general-purpose computer device (e.g., a Central Processing Unit (CPU)), a single chip microcomputer or a microcontroller. In a possible embodiment of the present disclosure, the controller may also be a dedicated hardware device, e.g., Programmable Logic Controller (PLC), Field Programmable Gate Array (FPGA), Application Specific Integrated Circuit (ASIC), Digital Signal Processor (DSP) or any other programmable logic control members. In a possible embodiment of the present disclosure, the controller may be a circuit board or a combination of several circuit boards, which may include: (1) one or more processors; (2) one or more non-transient computer-readable storage medium connected to the processors; and/or (3) firmware stored in the storage medium.

Figure 4A:
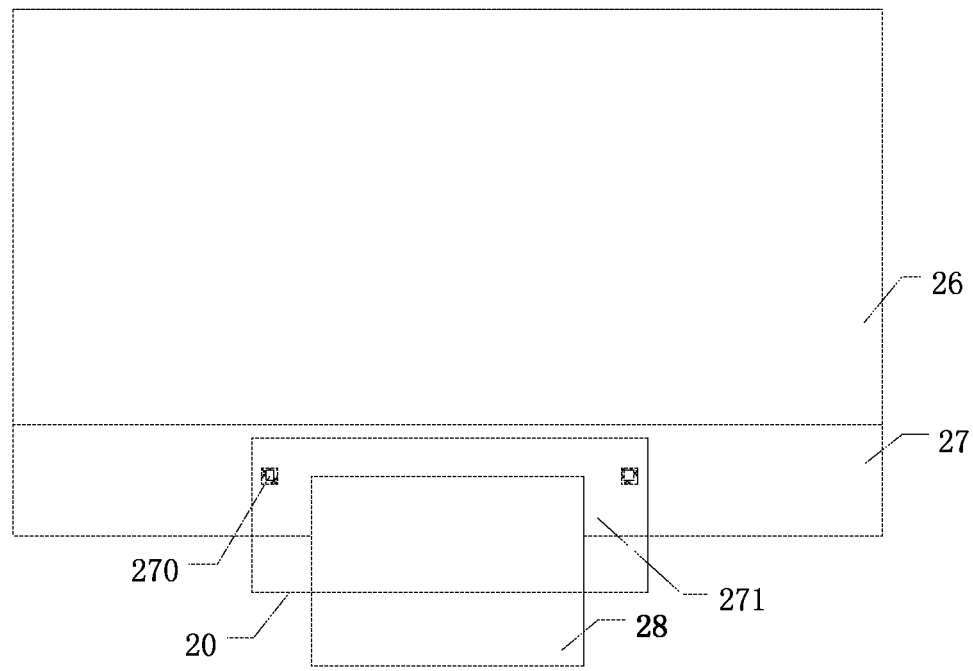
FIG. 4a is a top view of a display panel according to one embodiment of the present disclosure.
Figure 4B:
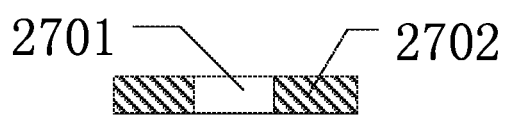
FIG. 4b is a sectional view of an alignment mark on the display panel according to one embodiment of the present disclosure.
Figure 4C:
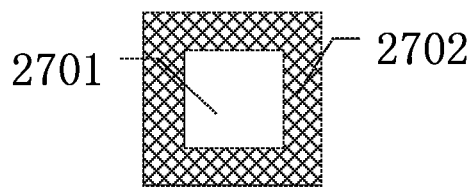
FIG. 4c is a top view of the alignment mark on the display panel according to one embodiment of the present disclosure.

FIG. 4a is a top view of a display panel, FIG. 4b is a sectional view of an alignment mark on the display panel, and FIG. 4c is a top view of the alignment mark on the display panel. For clarification, FIGS. 4a-4c merely show a part of the display panel.

As shown in FIG. 4a, the display panel includes a first substrate 26 and a second substrate 27. The second substrate 27 includes a display region and a binding region 271 surrounding the display region, and the alignment mark 270 is arranged at the binding region 271. In a possible embodiment of the present disclosure, there may be a plurality of alignment marks 270, which may be arranged in one-to-one correspondence with the first alignment holes 201 in the binding head 20 and the second alignment holes 211 in the support platform 21. As a result, it is able to align the display panel with the above-mentioned binding device, thereby to improve the binding alignment accuracy, the binding effect and the binding efficiency, and increase the yield of the product.

In a possible embodiment of the present disclosure, as shown in FIG. 4b, the alignment mark 270 includes a light-shielding region 2702 and a transparent region 2701 arranged inside the light-shielding region 2702.

In a possible embodiment of the present disclosure, a TFT may be arranged at the display region of the display panel, and the light-shielding region 2720 of the alignment mark 270 may be created from a layer identical to a gate electrode of the TFT, or identical to a source electrode and a drain electrode of the TFT. In the case that the alignment mark 270 is created from the gate electrode or the source/drain electrodes of the TFT, it is able to form the alignment mark without any additional layers or masks for the display panel, thereby to performing the alignment during the binding, reduce the manufacture cost and the production tact and effectively improve production capacity.

In a possible embodiment of the present disclosure, the light-shielding region 2702 may be made of a nontransparent metal, e.g., a copper-based metal, an aluminum-based metal or a nickel-based metal. In a possible embodiment of the present disclosure, the copper-based metal may be copper (Cu), or a copper-based metal alloy having stable performance, e.g., a copper-zinc alloy (CuZn), a copper-nickel alloy (CuNi) or a copper-zinc-nickel alloy (CuZnNi).

In a possible embodiment of the present disclosure, as shown in FIG. 4, the alignment mark 270 may of a circular structure, and the transparent region 2701 may be located in the middle of the circular structure.

In a possible embodiment of the present disclosure, the alignment mark 270 may be a ring, an elliptical ring or polygonal ring. The polygonal ring may be a regularly polygonal ring, e.g., a square ring, a regularly pentagonal ring or a regularly hexagonal ring. In a possible embodiment of the present disclosure, the alignment mark may be of a shape identical to a section of the first alignment hole or the second alignment hole.

In a possible embodiment of the present disclosure, the display panel may be a liquid crystal display panel, the first substrate 26 may be a color filter substrate, and the second substrate 27 may be an array substrate.

In a possible embodiment of the present disclosure, the display panel may also be an Organic Light-Emitting Diode (OLED) display panel, the first substrate 26 may be a package substrate, and the second substrate 27 may be an array substrate.

Figure 5A:
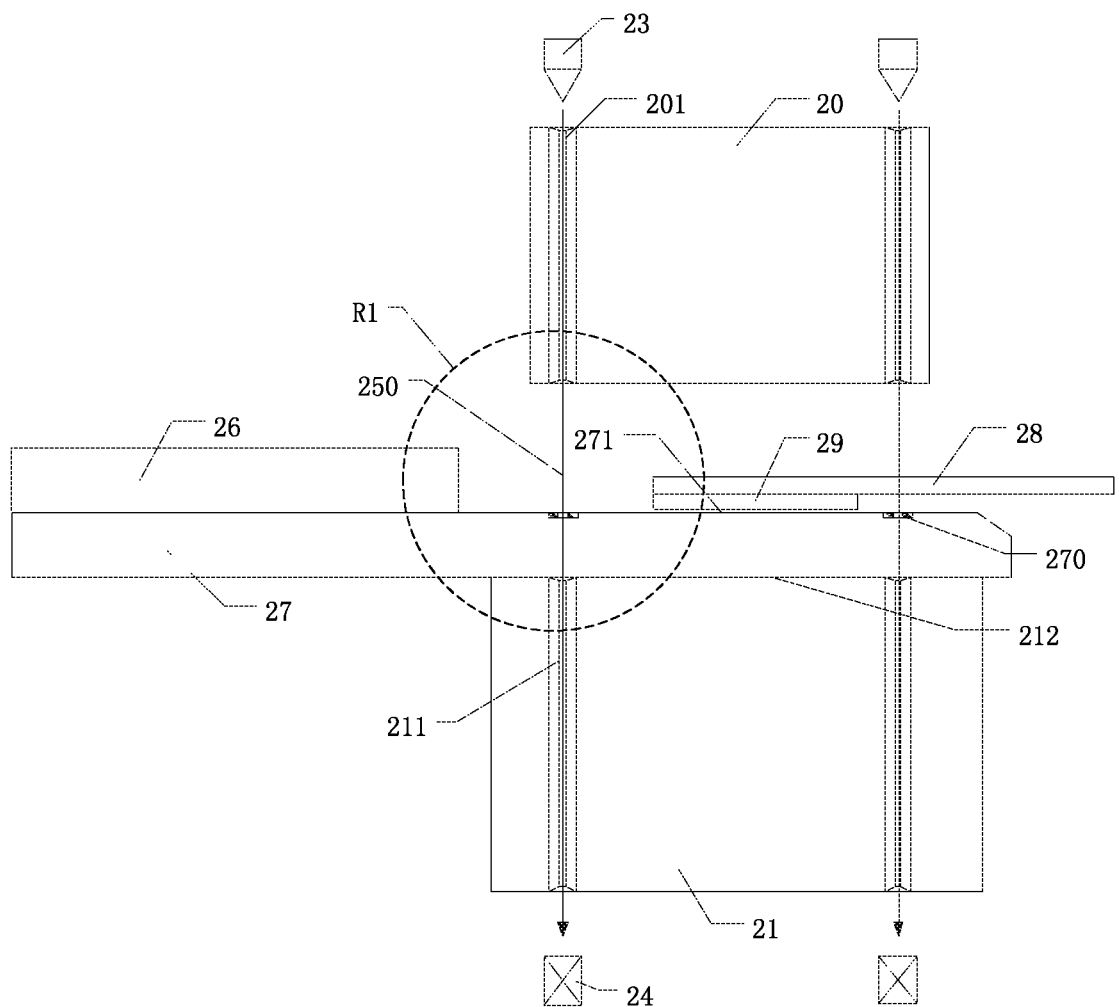
FIG. 5a is a side view of a binding system according to one embodiment of the present disclosure.
Figure 5B:
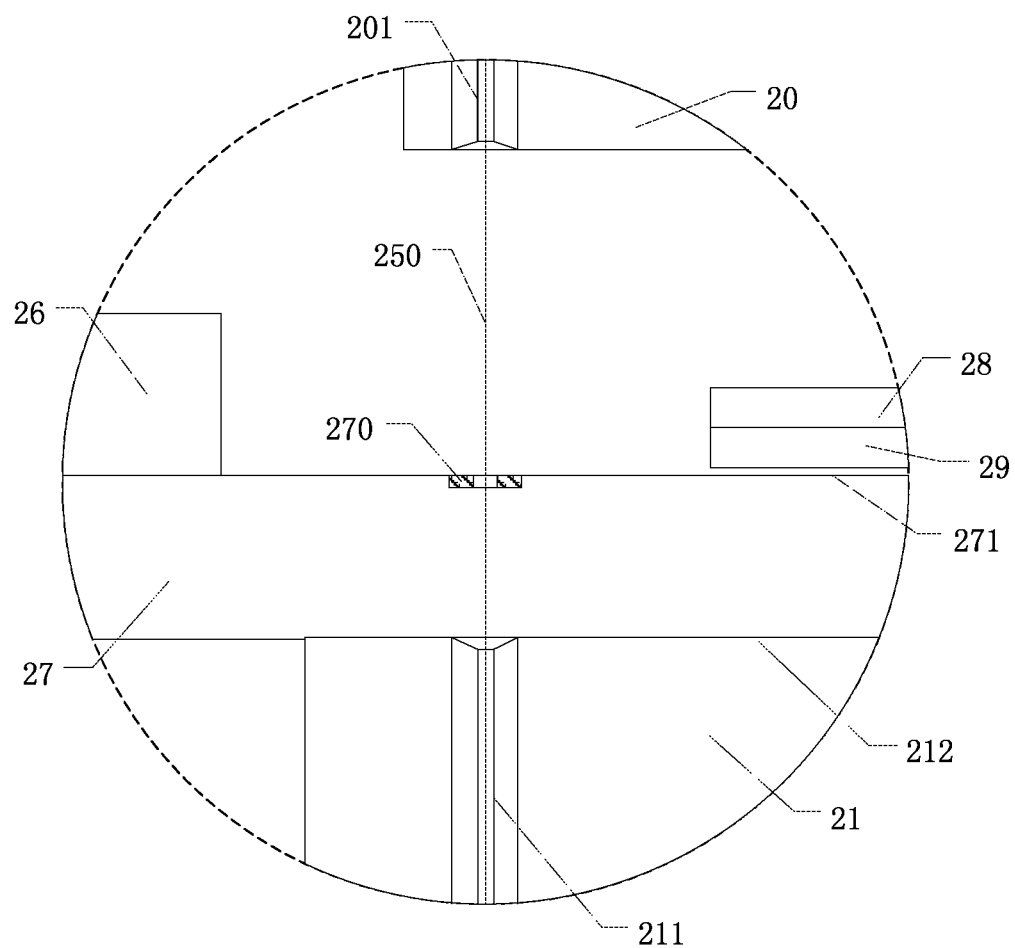

FIG. 5a is a side of a binding system, and FIG. 5b is an enlarged view of region R1 in FIG. 5a. For clarification, FIGS. 5a and 5b merely show a part of the binding system.

In a possible embodiment of the present disclosure, as shown in FIG. 5a, the binding system includes the above-mentioned binding device and display panel. The support surface 212 of the support platform 21 of the binding device is configured to carry thereon the display panel. The light emitter 23 is configured to emit the light 250 which may be transmitted sequentially through the first alignment hole 201, the alignment mark 270 and the second alignment hole 211 and then received by the light receiver 24. According to the binding system in the embodiments of the present disclosure, during the consecutive binding process, the position and/or posture of the binding head 20, the position and/or flatness of the binding region 271 of the display panel, and the alignment degree between the binding head and the display panel may be monitored in real time through detecting a size and a shape of a spot formed by the light 250 received by the light receiver 24, and then the binding head 20, the display panel and the alignment degree therebetween may be adjusted in real time through the controller. As a result, it is able to improve the binding alignment accuracy, the binding effect and the binding efficiency, and increase the yield of the product.

In a possible embodiment of the present disclosure, a pore size of the transparent region 2701 of the alignment mark 270 is greater than a pore size of the first alignment hole 201 and/or a pore size of the second alignment hole 201, so that the light 250 passing through the first alignment hole 201 or the second alignment hole 211 may be completely transmitted through the transparent region 2701 of the alignment mark 270.

In a possible embodiment of the present disclosure, the binding system further includes a flexible circuit board 28 and an anisotropic electrically-conductive adhesive 29. During the binding operation, the control of the binding device may be further configured to, through the power and transmission mechanism such as electric motor and gear, control the binding head 20 to reciprocably move in the direction perpendicular to the support surface of the support platform 21. At this time, the binding head 20 may apply a high temperature and a high pressure to the flexible circuit board 28, so as to adhere the binding region 271 to the flexible circuit board 28 through the anisotropic electrically-conductive adhesive 29, thereby to bind the display panel to the flexible circuit board. In a possible embodiment of the present disclosure, the anisotropic electrically-conductive adhesive 29 may consist of a binder, an electrically-conductive filler, a curing agent, a diluent, a flexiblizer and some other adjuvants. The anisotropic electrically-conductive adhesive 29 is insulative in its horizontal direction and electrically-conductive in its longitudinal direction.

As shown in FIG. 5b, in the case that the binding head 20 is not inclined and not deflected in the direction parallel to the support surface 212, the binding region 271 of the display panel is flat and the position thereof is not deflected, and the relative position of the binding head relative to the binding region 270 of the display panel is accurate, the light 250 from the light emitter 23 may be completely and sequentially transmitted through the first alignment hole 201, the alignment mark 270 and the second alignment hole 211 and then received by the light receiver 24. At this time, the spot formed by the light 250 may be of a complete shape, i.e., no deformation may occur.

It should be appreciated that, the inclination degree of the binding head 20 may be represented by an angle between a surface of the binding head 20 adjacent to the support platform 21 and the support surface 212. The larger the angle, the larger the inclination degree. In the case that the surface of the binding head 20 adjacent to the support platform 21 is parallel to the support surface 212, the angle is 0.

It should be appreciated that, the structure of the binding device as well as the structure and the material of the display panel may be identical to those mentioned above, and thus will not be particularly defined herein.

Figure 6A:
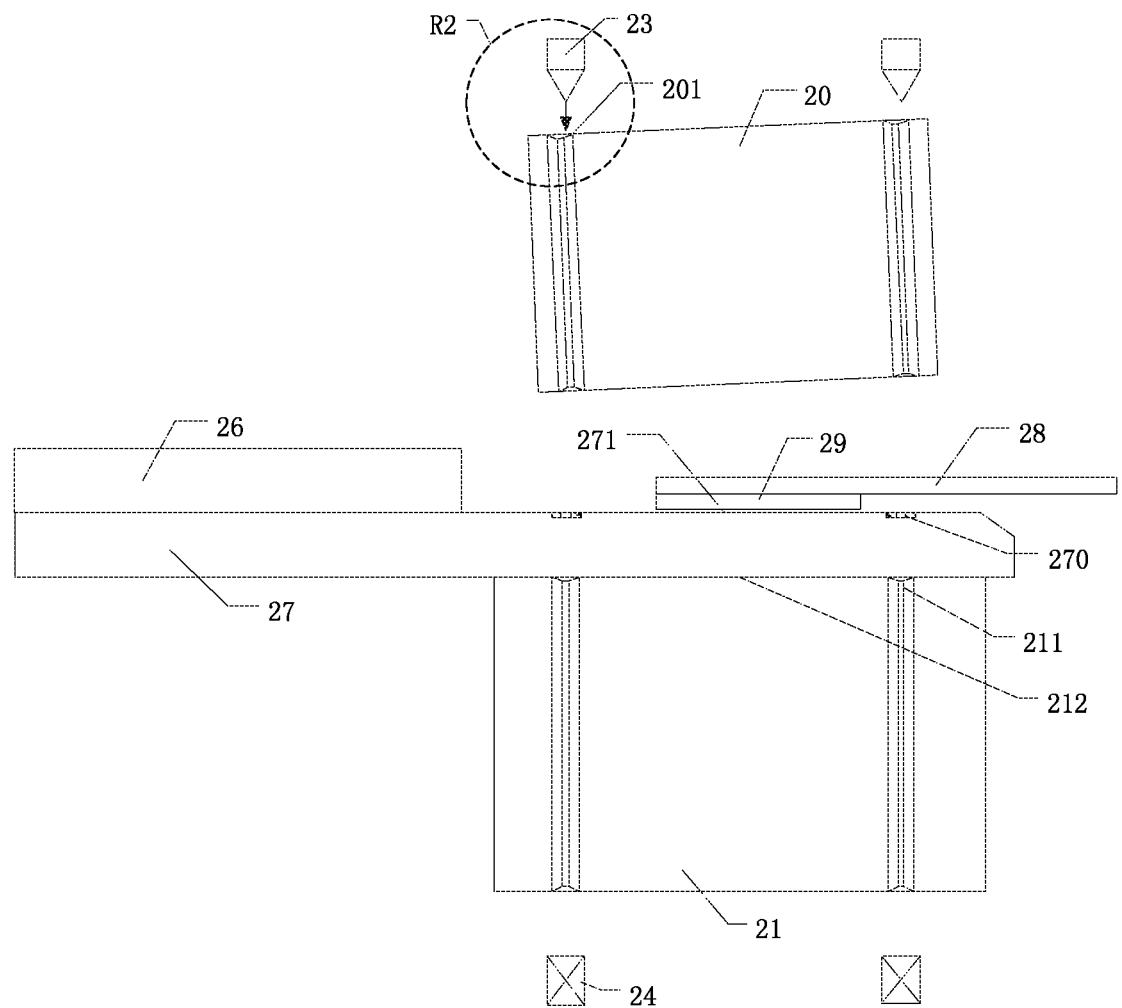
FIG. 6a is a schematic view showing the binding system where a binding head is in an oblique state according to one embodiment of the present disclosure.
Figure 6B:
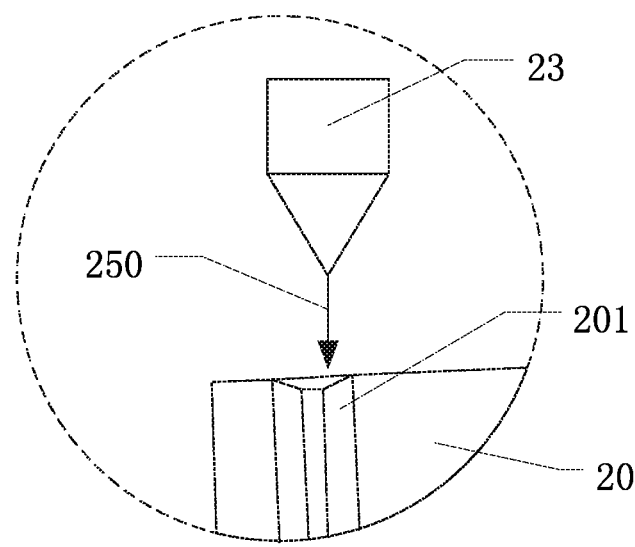
Figure 7A:
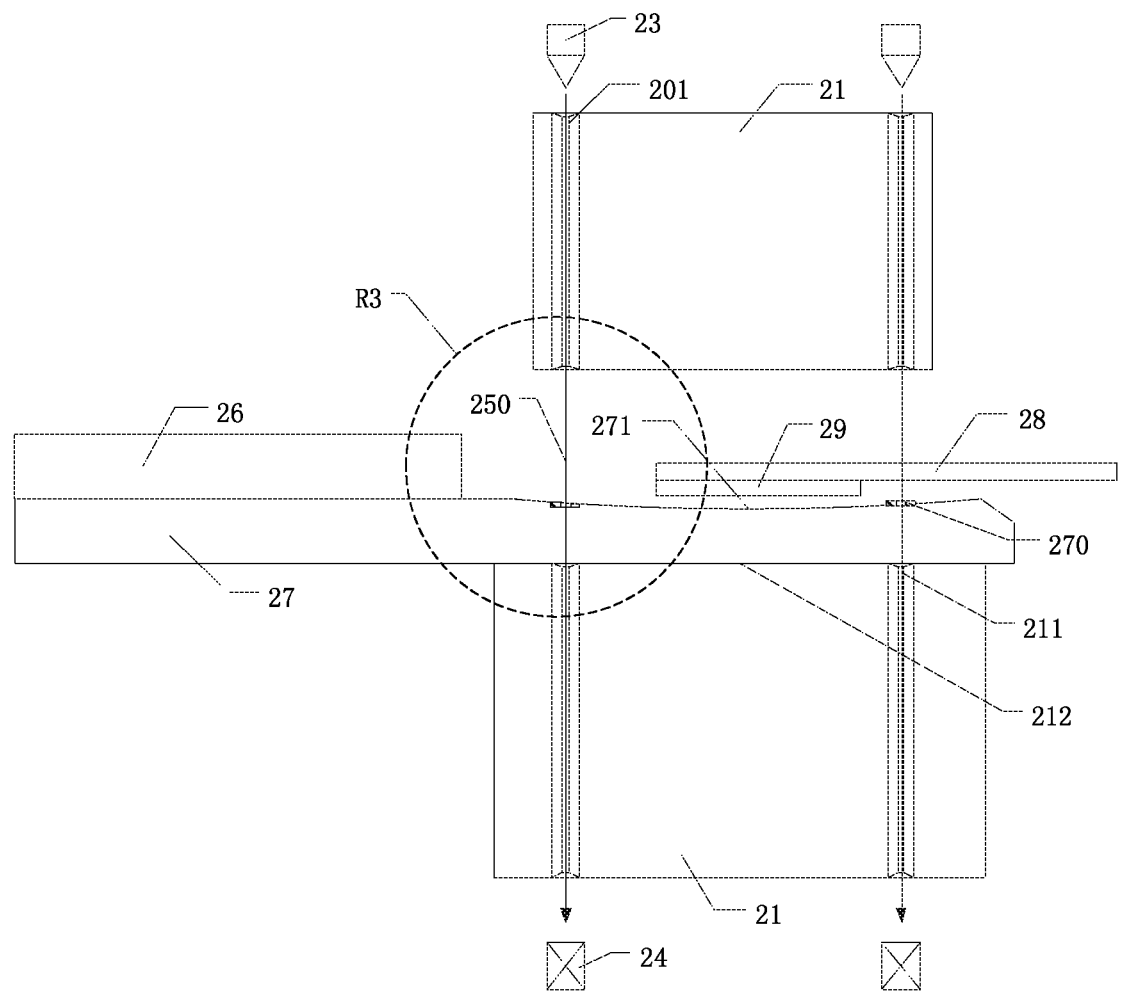
FIG. 7a is a schematic view showing the binding system where the display panel is in a deformed state according to one embodiment of the present disclosure.
Figure 7B:
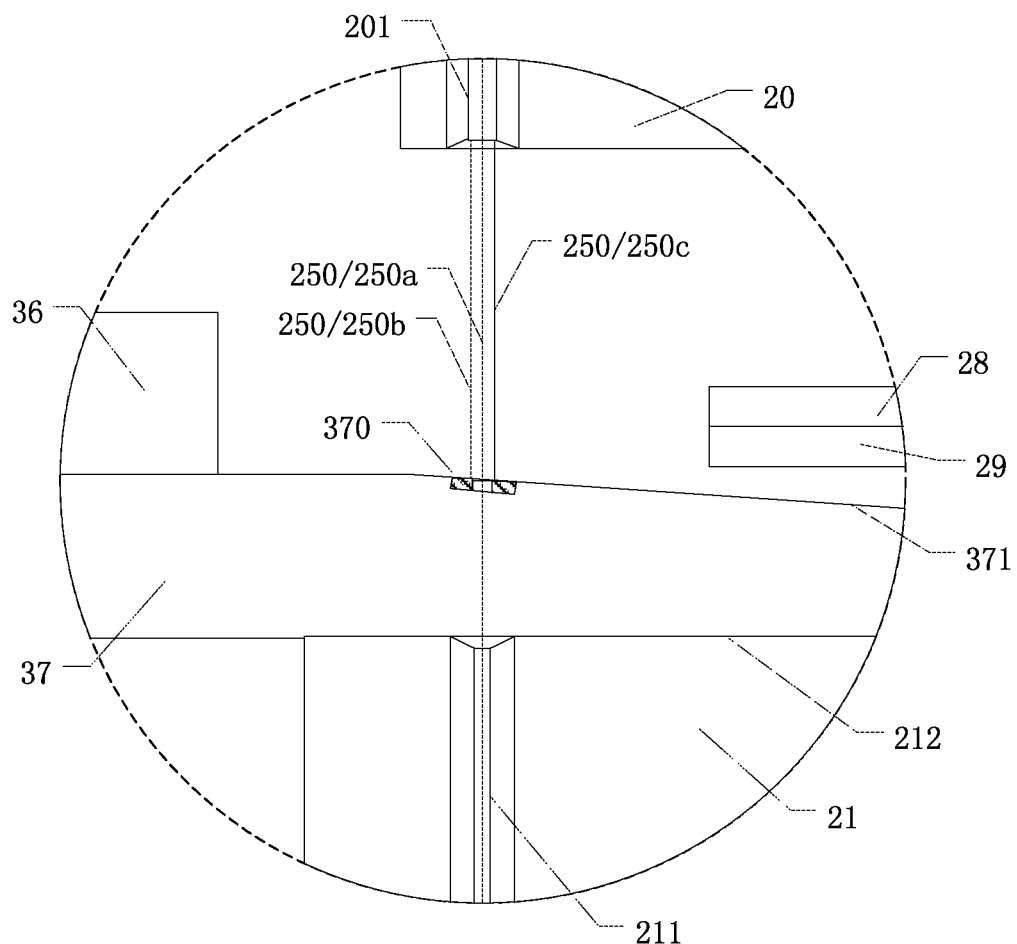

The present disclosure further provides in some embodiments an operating method for the above-mentioned binding system. FIG. 6a is a schematic view showing the binding system where the binding head is in an oblique state, FIG. 6b is an enlarged view of region R2 in FIG. 6a, FIG. 7a is a schematic view showing the binding system where the display panel is in a deformed state, FIG. 7b is an enlarged view of region R3 in FIG. 7a, FIG. 8a is a flow chart of the operating method for the binding system, FIG. 8b is a flow chart of aligning the binding head in the operating method, and FIG. 8c is a flow chart of aligning the display panel in the operating method.

Figure 8A:
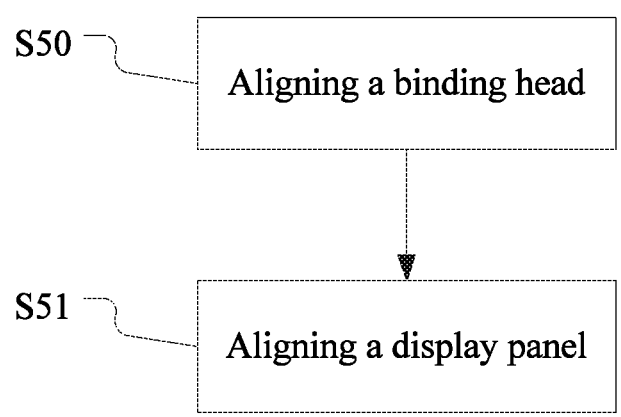
FIG. 8a is a flow chart of an operating method for the binding system according to one embodiment of the present disclosure.
Figure 8B:
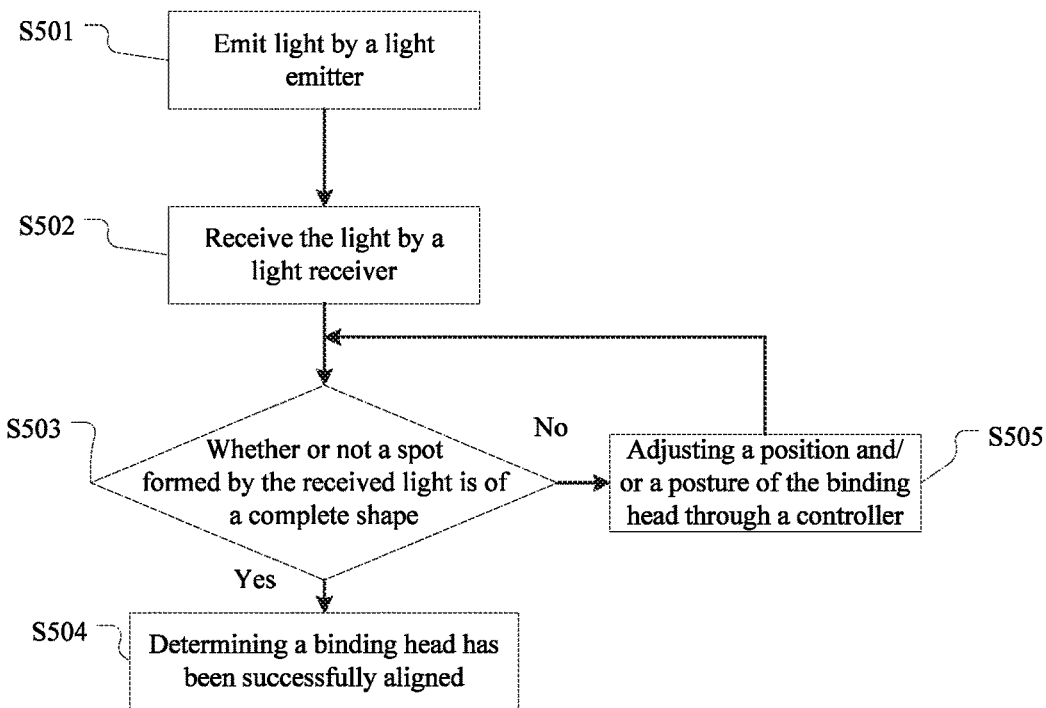
FIG. 8b is a flow chart of aligning the binding head according to one embodiment of the present disclosure.
Figure 8C:
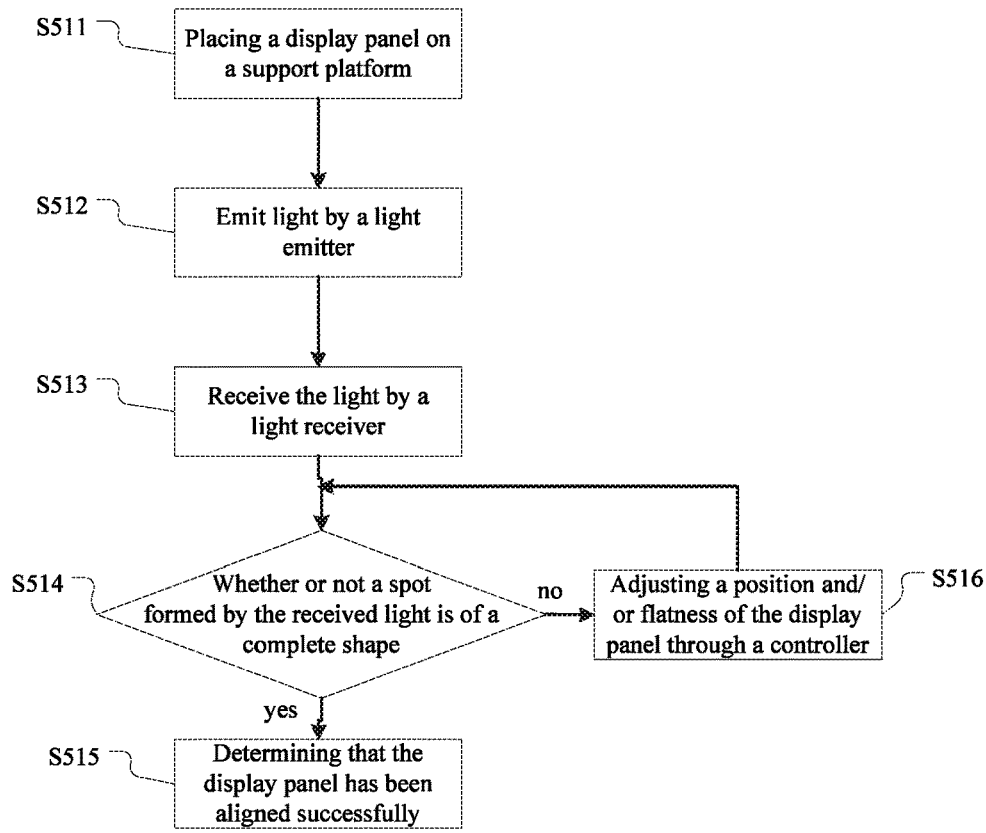
FIG. 8c is a flow chart of aligning the display panel according to one embodiment of the present disclosure.

As shown in FIG. 8a, the operating method includes: Step S50 of aligning the binding head, so that the light receiver is capable of receiving the light emitted by the light emitter and transmitted through the first alignment hole and the second alignment hole; and Step S51 of aligning the display panel, so that the light receiver is capable of receiving the light emitted by the light emitter and transmitted through the first alignment hole, the alignment mark and the second alignment hole.

In a possible embodiment of the present disclosure, subsequent to the steps of aligning the binding head and aligning the display panel, a high temperature and a high pressure may be applied by the binding head 20 to the flexible circuit 28 under the control of the controller, so as to adhere the binding region 271 to the flexible circuit board 28 through the anisotropic electrically-conductive adhesive 29, thereby to bind the display panel to the flexible circuit board 28.

In a possible embodiment of the present disclosure, during the binding process, the binding head 20 may be aligned at first, and then the display panel may be aligned. In the case that the spot formed by the light 250 received by the light receiver 24 is of a complete shape, the binding operation may be performed. In the case that the spot formed by the light 250 received by the light receiver 24 is of an incomplete shape or the light receiver 24 fails to receive the light 250, the binding head 20 or the display panel may be adjusted through the controller, until the spot of the complete shape is formed by the light 250 received by the light receiver 24. In this way, it is able to accurately align the binding head 20 with the binding region 271 of the display panel, thereby to improve the binding alignment accuracy, the binding effect and the binding efficiency, and increase the yield of the product.

It should be appreciated that, in the case that there is a plurality of light receivers 24, the shape of the spot formed by the light 250 received by one or more of the light receivers 24 may be detected, so as to determine the position and/or posture of the binding head 20, the position and the flatness of the binding region 271 of the display panel, or the alignment degree between the binding head 20 and the display panel.

In a possible embodiment of the present disclosure, as shown in FIG. 8b, the step of aligning the binding head may include: Step S501: emitting by the light emitter 23 the light 250; Step S502 of receiving by the light receiver 25 the light 250; Step S503 of determining whether or not the spot formed by the received light 250 is complete; Step S504 of, in the case that the spot formed by the received light 250 is complete, determining that the binding head has been aligned successfully; and Step S505 of, in the case that the spot formed by the received light 250 is incomplete, adjusting, through the controller, the position and/or posture of the binding head 20 until the spot formed by the received light 250 is complete, and returning to Step S504.

Here, in Step S502, the light 250 may be transmitted sequentially through the first alignment hole 201 and the second alignment hole 211. It should be appreciated that, in Step 502, the light receiver 24 may not receive the light 250. For example, in the case that the binding head 20 is seriously inclined or deflected significantly in the direction parallel to the support surface 212, the light 250 may not be transmitted through the first alignment hole 201, and at this time, it may not be received by the light receiver 24.

For example, in the case that the binding head 20 is inclined or deflected in the direction parallel to the support surface of the support platform 21, the light from the light emitter 23 may not enter the first alignment hole 201 or a part of the light may enter the first alignment hole 201. At this time, the spot formed by the light 250 received by the light receiver 24 may be incomplete, or no light 250 may be received by the light receiver 24.

For example, as shown in FIGS. 6a and 6b, in the case that the binding head 20 is inclined or deflected in the direction parallel to the support surface 212, the light 250 from the light emitter 23 may not enter the first alignment hole 201, or merely a part of the light 250 may enter the first alignment hole 201. At this time, the light receiver may not receive, or may merely receive a part of, the light 250, and thereby no spot may be formed or the spot formed by the light 250 received by the light receiver 24 may be incomplete. In the case that the spot formed by the light 250 received by the light receiver 24 is incomplete or no light 250 is received by the light receiver 24, the position and/or posture of the binding head 20 may be adjusted through the controller until the complete sot is formed by the received light 250, and then the binding head may be aligned.

The alignment of the display panel may be performed subsequent to the alignment of the binding head. As shown in FIG. 8c, the step of aligning the display panel may include: Step S511 of placing the display panel onto the support platform 21; Step S512 of enabling the light emitter 23 to emit the light 250; Step S513 of enabling the light receiver 24 to receive the light 250; Step S514 of determining whether or not the spot formed by the received light 250 is complete; Step S515 of, in the case that the spot formed by the received light 250 is complete, determining that the display panel has been aligned successfully; and Step S516 of, in the case that the spot formed by the received light 250 is incomplete, adjusting the position and/or flatness of the display panel through the controller until the spot formed by the received light 250 is complete, and returning to Step S515.

In Step S513, the light 250 may be transmitted sequentially through the first alignment hole 201, the alignment mark 270 and the second alignment hole 211. It should be appreciated that, in Step S513, the light receiver 24 may not receive the light 250. For example, in the case that the binding region 271 of the display panel is curved seriously, the light 250 transmitted through the first alignment hole 201 or the second alignment hole 211 to the binding region 271 may be completely shielded by the light-shielding region 2702 of the alignment mark 270, and at this time the light 250 may not be received by the light receiver 24.

In the case that the binding region 271 of the display panel is not flat, e.g., in the case that the binding region 271 is curved, inclined or deformed in any other forms, or in the case that the binding region 271 of the display panel is offset, the alignment mark 270 may be curved or offset, and at this time, the spot formed by the light 250 received by the light receiver 24 may be incomplete or no light 250 may be received by the light receiver 24.

For example, as shown in FIGS. 7a and 7b, the light 250 from the light emitter 23 may be transmitted through the first alignment hole 201 to the display panel. In the case that the binding region 271 is curved, the alignment mark 270 at the binding region 271 may be curved too. A first portion of the light 250a may be transmitted through the transparent region 2701 of the alignment mark 270 and the second alignment hole 211, and finally received by the light receiver 24. However, a second portion of the light 250b and a third portion of the light 250c may be shielded by the shielding regions 2702 of the alignment mark 270, and thus may not be received by the light receiver 24. At this time, an incomplete spot may be formed by the first portion of the light 250a. In the case that the light 250 is completely shielded by the shielding regions 2702 of the alignment mark 270, it may not be received by the light receiver 24. In the case that the spot formed by the light 250 received by the light receiver 24 is incomplete or no light 250 is received by the light receiver 24, the flatness and/or position of the display panel may be adjusted through the controller until the complete spot is formed by the light 250, and then the display panel may be aligned.

In a possible embodiment of the present disclosure, in the case that the binding region 271 of the display panel is deformed seriously and/or offset significantly, the binding head 20 is inclined and/or deflected seriously, or the relative position of the binding head 20 to the display panel is inaccurate obviously, it is impossible to acquire the complete spot formed by the received light 250 even through adjusting the position and/or posture of the binding head 20, and the position and/or flatness of the display panel. At this time, the display panel may be removed, and the binding operation may be performed manually or the display panel may be discarded.

It should be appreciated that, in the case that the incomplete spot is formed by the light 250 received by the light receiver 24, apart from the binding head 20 and the display panel, the position and/or posture of the support platform 21 may also be adjusted, so as to enable the light 250 to be completely received by the light receiver 24, thereby to form the complete spot.

In the embodiments of the present disclosure, the term "identical layer" refers to a layer structure formed by patterning a film layer, which is formed through an identical film-forming process and used for forming a specific pattern, through a single patterning process using an identical mask plate. Depending on the specific patterns, the patterning process may include a plurality of exposing, developing or etching processes. The specific patterns of the formed layer structure may be continuous or discontinuous, and they may be at different levels or have different thicknesses. In addition, the term "posture" may refer to a spatial state of an object.

It should be appreciated that, (1) the drawings in the embodiments of the present disclosure merely refer to the necessary structures, and any other structure may refer to a common design. (2) For clarification, the thicknesses of the layers or regions in the drawings are zoomed in or out, i.e., the drawings are not used to reflect an actual scale. (3) In the case of no conflict, the embodiments of the present disclosure and the features therein may be combined in any form to acquire new embodiments.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An operating method for a binding system, the binding system comprises a binding device and a display panel, wherein the binding device comprises a binding head, a support platform, at least one light emitter, and at least one light receiver, wherein the binding head is provided with at least one first alignment hole, the support platform is provided with at least one second alignment hole at a position corresponding to the at least one first alignment hole, the at least one light emitter is configured to emit light toward the at least one first alignment hole and the at least one light receiver is configured to receive the light from the at least one light emitter through the at least one second alignment hole, or the at least one light emitter is configured to emit the light toward the at least one second alignment hole and the at least one light receiver is configured to receive the light from the at least one light emitter through the at least one first alignment hole, the display panel comprises a display region and a binding region surrounding the display region, at least one alignment mark is arranged at the binding region for alignment with the binding device, and the support platform of the binding device is configured to support thereon the display panel, and the operating method comprises steps of:

aligning the binding head; and aligning the display panel;

wherein the step of aligning the binding head comprises:

emitting light by the at least one light emitter;

receiving, by the at least one light receiver, the light through the at least one first alignment hole, and the at least one second alignment hole;

in a case that the received light forms a complete spot corresponding to transmission of all of the emitted light through the at least one first alignment hole and the at least one second alignment hole, determining that the binding head has been aligned successfully; and in the case that the received light fails to form the complete spot, adjusting a position and/or posture of the binding head until the complete spot is formed.

2. An operating method for a binding system, the binding system comprises a binding device and a display panel, wherein the binding device comprises a binding head, a support platform, at least one light emitter, and at least one light receiver, wherein the binding head is provided with at least one first alignment hole, the support platform is provided with at least one second alignment hole at a position corresponding to the at least one first alignment hole, the at least one light emitter is configured to emit light toward the at least one first alignment hole and the at least one light receiver is configured to receive the light from the at least one light emitter through the at least one second alignment hole, or the at least one light emitter is configured to emit the light toward the at least one second alignment hole and the at least one light receiver is configured to receive the light from the at least one light emitter through the at least one first alignment hole, the display panel comprises a display region and a binding region surrounding the display region, at least one alignment mark is arranged at the binding region for alignment with the binding device, and the support platform of the binding device is configured to support thereon the display panel, and the operating method comprises steps of:

aligning the binding head; and aligning the display panel;

wherein the step of aligning the display panel comprises:

placing the display panel onto a support surface of the support platform;

emitting light by the at least one light emitter;

receiving, by the at least one light receiver, the light through the at least one first alignment hole, the at least one second alignment hole, and the at least one alignment mark;

in a case that the received light forms a complete spot corresponding to complete transmission of the emitted light through the at least one first alignment hole, the at least one second alignment hole, and the at least one alignment mark, determining that the display panel is aligned successfully; and in the case that the received light fails to form the complete spot, adjusting a position and/or flatness of the display panel until the complete spot is formed.

* * * * *